US008877547B2

(12) United States Patent  
Seo et al.

(10) Patent No.: US 8,877,547 B2
(45) Date of Patent: *Nov. 4, 2014

(54) THIN FILM TRANSISTOR INCLUDING ORGANIC SEMICONDUCTOR LAYER AND SUBSTRATE INCLUDING THE SAME

(75) Inventors: Hyun-Sik Seo, Annyang-si (KR); Nack-Bong Choi, Suwon-si (KR)

(73) Assignee: LG Display Co., Ltd., Seoul (KR)

( * ) Notice: Subject to any disclaimer, the term of this patent is extended or adjusted under 35 U.S.C. 154(b) by 387 days.

This patent is subject to a terminal disclaimer.

(21) Appl. No.: 13/115,477

(22) Filed: May 25, 2011

(65) Prior Publication Data

US 2011/0223715 A1    Sep. 15, 2011

Related U.S. Application Data

(62) Division of application No. 11/397,555, filed on Apr. 5, 2006.

(30) Foreign Application Priority Data

Apr. 6, 2005 (KR) .............................. 2005-0028348

(51) Int. Cl.
*H01L 51/30* (2006.01)
*H01L 51/40* (2006.01)
*H01L 51/10* (2006.01)
*H01L 51/05* (2006.01)
*H01L 51/00* (2006.01)

(52) U.S. Cl.
CPC .......... *H01L 51/105* (2013.01); *H01L 51/0545* (2013.01); *H01L 51/0052* (2013.01); *H01L 51/0011* (2013.01); *H01L 51/0516* (2013.01); *H01L 51/0059* (2013.01); *H01L 51/0036* (2013.01)
USPC ..................................... 438/99; 257/E51.025

(58) Field of Classification Search
CPC .......................... H01L 51/0545; H01L 51/105
USPC ............ 257/40, E51.001–E51.007, E51.024, 257/E51.025; 438/99
See application file for complete search history.

(56) References Cited

U.S. PATENT DOCUMENTS

| 6,111,361 A | 8/2000 | Xu et al. |
| 7,566,899 B2 | 7/2009 | Chabinye et al. |
| 2003/0112382 A1 | 6/2003 | Takahashi et al. |
| 2004/0012017 A1 | 1/2004 | Nagayama |
| 2004/0108562 A1 | 6/2004 | Nagayama et al. |

(Continued)

OTHER PUBLICATIONS

Christou, V., et al. "High Resolution X-ray Photoemission Study of Plasma Oxidation of Indium—Tin—Oxide Thin Film Surfaces." J. Appl. Phys., vol. 88, No. 9 (Nov. 1, 2000): pp. 5180-5187.*

(Continued)

*Primary Examiner* — Steven J Fulk
*Assistant Examiner* — Eric Ward
(74) *Attorney, Agent, or Firm* — Birch, Stewart, Kolasch & Birch, LLP

(57) ABSTRACT

Provided is a thin film transistor including a gate electrode on a substrate; a gate insulating layer on the gate electrode; source and drain electrodes including first source and drain layers on the gate insulating layer, respectively, and spaced apart from each other, wherein at lease one of the first source and drain layers includes indium-tin-oxide doped with at least one Group III element; and an organic semiconductor layer on the gate insulating layer and contacting the first source and drain layers.

6 Claims, 8 Drawing Sheets

(56) References Cited

U.S. PATENT DOCUMENTS

| 2004/0134878 | A1 | 7/2004 | Matsushita et al. |
| 2004/0258920 | A1* | 12/2004 | Bender ................... 428/411.1 |
| 2005/0057136 | A1 | 3/2005 | Moriya et al. |
| 2005/0140307 | A1 | 6/2005 | Park |
| 2006/0214154 | A1 | 9/2006 | Yang et al. |

OTHER PUBLICATIONS

Zhu, F., et al. "Investigation of Annealing Effects on Indium Tin Oxide Thin Films by Electron Energy Loss Spectroscopy." Thin Solid Films, vol. 359 (2000): pp. 244-250.*

"Novel Surface Modification of Indium—Tin—Oxide Films Using Ion Implantation for Organic Light-Emitting Diodes" in Japanese Journal of Applied Physics, vol. 43 No. 8A, 2004, pp. 5516-5519, published Aug. 10, 2004, to Choi et al.*

"Polycrystalline pentacene thin films for large area electronic applications" in Journal of Non-Crystalline Solids 299-302 (2002) 1042-1046 to D. Knipp et al.*

Canhola, P. et al. Role of Annealing Environment on the Performances of Large Area ITO Films Prouced by RF Magnetron Sputtering, Thin Sol Films, vol. 487 (2005), pp. 271-276.

Choi et al., Novel Surface Modification of Indium—Tin—Oxide Films Using Ion Implantation for Organic Light-Emitting Diodes, Japanese Journal of Applied Physics, vol. 43, No. 8A, 2004, pp. 5516-5519.

Cui et al., Indium Tin Oxide Alternatives—High Work Function Transparent Conducting Oxides As Anodes for Organic Light-Emitting Diodes, Advanced Materials, 2001, 13, No. 19, Oct. 2, 2001.

Knipp et al., Polycrystalline Pentacene Thin Films for Large Area Electronic Applications, Journal of Non-Crystalline Solids, 299-302 (2002), pp. 1042-1046.

Martin, S. et al., Gate-Planarized Organic Polymer Thin Film Transistors, J. Elect. Mater, vol. 31, No. 5, (2002), pp. 512-519.

* cited by examiner

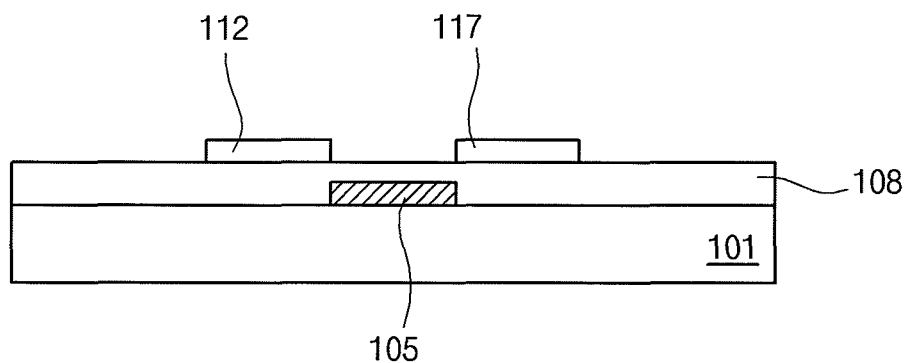
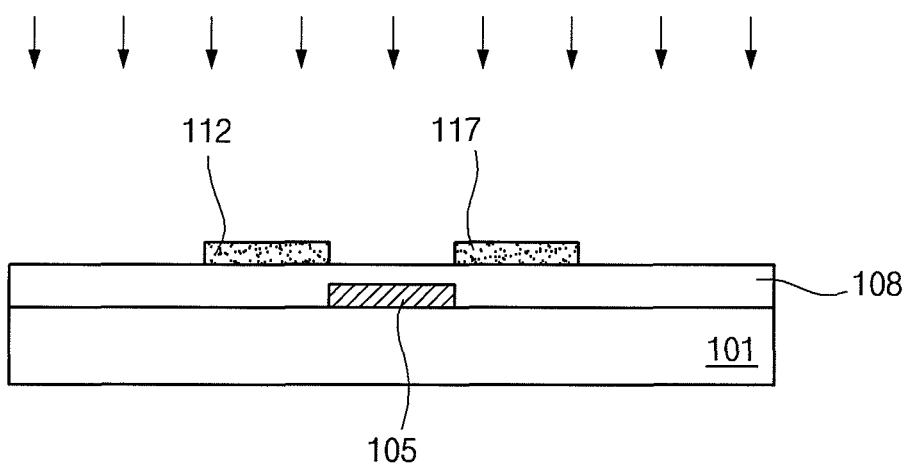

ion doping evaporation

THIN FILM TRANSISTOR INCLUDING ORGANIC SEMICONDUCTOR LAYER AND SUBSTRATE INCLUDING THE SAME

This application is a divisional application of U.S. application Ser. No. 11/397,555 filed Apr. 5, 2006 which application claimed the benefit of Korean Patent Application No. 10-2005-0028348, filed in Korea on Apr. 6, 2005. Both applications are hereby incorporated in their entirety.

FIELD OF THE INVENTION

The present invention relates to a thin film transistor including an organic semiconductor layer, and more particularly, to an organic thin film transistor including an organic semiconductor layer and an array substrate including the same.

DISCUSSION OF THE RELATED ART

Until recently, display devices have typically used cathode-ray tubes (CRTs). Presently, much effort is being expended to study and develop various types of flat panel displays, such as liquid crystal display (LCD) devices, plasma display panels (PDPs), field emission displays (FED), and electro-luminescence displays (ELDs), as a substitute for CRTs. In particular, these types of flat panel displays have been driven in an active matrix type display in which a plurality of pixels arranged in a matrix form are driven using a plurality of thin film transistors therein. Among the active matrix types of flat panel displays, liquid crystal display (LCD) devices and electroluminescent display (ELD) devices are widely used as monitors for notebook computers and desktop computers because of their high resolution, ability to display colors and superiority in displaying moving images.

In general, an LCD device includes two substrates that are spaced apart and face each other with a liquid crystal material interposed between the two substrates. The two substrates include electrodes that face each other such that a voltage applied between the electrodes induces an electric field across the liquid crystal material. Alignment of the liquid crystal molecules in the liquid crystal material changes in accordance with the intensity of the induced electric field in the direction of the induced electric field, thereby changing the light transmissivity of the LCD device. Thus, the LCD device displays images by varying the intensity of the induced electric field.

FIG. 1 is a perspective view of an LCD device according to the related art. As shown in FIG. 1, the LCD device includes a lower substrate 10, an upper substrate 20 and a liquid crystal material 30. The lower substrate 10 is referred to as an array substrate that includes a gate line 14 and a data line 16 on a first substrate 12 that cross each other to define a pixel region "P". A pixel electrode 18 and a thin film transistor "T", as a switching element, are positioned in each pixel region "P". Thin film transistors "T", which are disposed adjacent to where the gate lines 14 and the data lines 16 cross, are disposed in a matrix form on the first substrate 12. The upper substrate 20 is referred to as a color filter substrate that includes color filter patterns 26 including red (R), green (G) and blue (B) color filter patterns 26a, 26b and 26c, respectively, on a second substrate 22, a black matrix 25 between the color filter patterns 26, and a common electrode 28 on both the color filter pattern 26 and the black matrix 25.

In the above related art LCD device, a hard type substrate such as a glass substrate has been used as each of the first and second substrates. In accordance that small-size portable display devices such as personal digital assistants (PDA) and notebook computers are presently widely used, much effort is being expended to study and develop a flexible substrate such as a plastic substrate having low weight and good flexibility. However, since processes of fabricating the substrate including the thin film transistor are conducted mainly at a high temperature of more than 200 degrees centigrade, it is difficult to use a flexible substrate as the substrate including the thin film transistor, instead of a glass substrate. Accordingly, a flexible substrate is used for the color filter substrate, and a hard type substrate is used for the array substrate.

When fabricating a substrate having the thin film transistor at a temperature of equal to or less than 200 degrees centigrade, electrodes and lines made of a metallic material, an insulating layer, a passivation layer and the like can be formed with low temperature deposition or coating without affecting the thin film transistor properties. However, when a semiconductor layer using amorphous silicon or poly-crystalline silicon is formed at a temperature of equal to or less than 200 degrees centigrade, semiconductor properties including electric conductivity are degraded and have defects, thus, a thin film transistor including it cannot function as a switching element.

Therefore, to overcome the above problems, effort is also being expended to study and develop a method for fabricating a thin film transistor and an array substrate at a low temperature of equal to or less than 200 degrees centigrade by using an organic semiconductor material.

FIG. 2 is a cross-sectional view of a thin film transistor of an array substrate for an LCD device using an organic semiconductor layer according to the related art.

As shown in FIG. 2, a gate electrode 55 and a gate line (not shown) are formed on a plastic substrate 51. Then, a gate insulating layer 58 is formed on the gate electrode 55 and the gate line. Then, gold (Au) is deposited on the gate insulating layer 58 and patterned to form source and drain electrodes 62 and 65 spaced apart from each other and a data line (not shown) connected to the source electrode 62. Then, an organic semiconductor material is deposited and patterned to form an organic semiconductor layer 70. Like this, in the related art, an organic semiconductor material is used to fabricate a thin film transistor and an array substrate at a temperature of equal to or less than 200 degrees centigrade.

As explained above, gold (Au) is used for the source and drain electrodes contacting the organic semiconductor layer 70. The reason for using gold (Au) is that gold (Au) has a high work function and low resistance. In more detail, in general, the source and drain electrodes have been made of silver (Ag), aluminum (Al) and copper (Cu) having low work functions of 4.26 eV, 4.28 eV and 4.65 eV, respectively. However, gold (Au) has a work function of 5.1 eV, which is higher than the above metallic materials. In the related art array substrate, the interface between the organic semiconductor layer and the source and drain electrodes has an energy barrier, and in experiment, the energy barrier decreases as the work function increases. Therefore, gold (Au), having a work function much higher than the above general metallic materials, is used to reduce the interface energy barrier, and thus the thin film transistor having the organic semiconductor layer has good properties.

However, there are some problems when using gold (Au). Due to the fact that gold (Au) is apt to diffuse, it is difficult to set line widths of the source and drain electrodes and the data line. Also, due to the fact that gold (Au) has bad adhesion properties, it can be stripped from the substrate.

Also, when deposition of gold (Au) is performed in a process chamber, gold (Au) can also stick to an inner wall of the process chamber. Accordingly, the stuck gold (Au) drops onto the substrate as an alien substance in another process. Also, because gold (Au) is expensive, the product cost increases.

SUMMARY OF THE INVENTION

By way of introduction only, in one aspect of the present invention, a thin film transistor includes a gate electrode on a substrate; a gate insulating layer on the gate electrode; source and drain electrodes including first source and drain layers on the gate insulating layer, respectively, and spaced apart from each other, wherein at least one of the first source and drain layers include indium-tin-oxide doped with at least one Group III element; and an organic semiconductor layer on the gate insulating layer and contacting the first source and drain layers. Preferably, the first source and drain layers both include indium-tin-oxide doped with at least one Group III element, preferably boron.

In another aspect of the present invention, there is provided a method of fabricating a thin film transistor including forming a gate electrode on a substrate; forming a gate insulating layer on the gate electrode; forming source and drain electrodes including first source and drain layers on the gate insulating layer, respectively, and spaced apart from each other, wherein at least one of the first source and drain layers include indium-tin-oxide doped with at least one Group III element; and forming an organic semiconductor layer on the gate insulating layer and contacting the first source and drain layers.

In another aspect of the present invention an array substrate includes a gate electrode on a substrate; a gate insulating layer on the gate electrode; source and drain electrodes including first source and drain layers on the gate insulating layer, respectively, and spaced apart from each other, wherein at least one of the first source and drain layers include indium-tin-oxide doped with at least one Group III element; an organic semiconductor layer on the gate insulating layer and contacting the first source and drain layers; and a data line connected to the source electrode.

In another aspect of the present invention, there is provided a method of fabricating an array substrate including forming a gate electrode on a substrate; forming a gate insulating layer on the gate electrode; forming source and drain electrodes including first source and drain layers on the gate insulating layer, respectively, and spaced apart from each other, wherein at least one of the first source and drain layers include indium-tin-oxide doped with at least one Group III element; forming an organic semiconductor layer on the gate insulating layer and contacting the first source and drain layers; and forming a data line connected to the source electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

FIGS. 3A to 3G are cross-sectional views of a method of fabricating an array substrate including a thin film transistor using an organic semiconductor material according to a first exemplary embodiment of the present invention.

DETAILED DESCRIPTION OF THE PREFERRED EMBODIMENTS

Reference will now be made in detail to the illustrated embodiments of the present invention, which are illustrated in the accompanying drawings.

FIGS. 3A to 3G are cross-sectional views of a method of fabricating an array substrate including a thin film transistor using an organic semiconductor material according to a first exemplary embodiment of the present invention.

Figure 1:
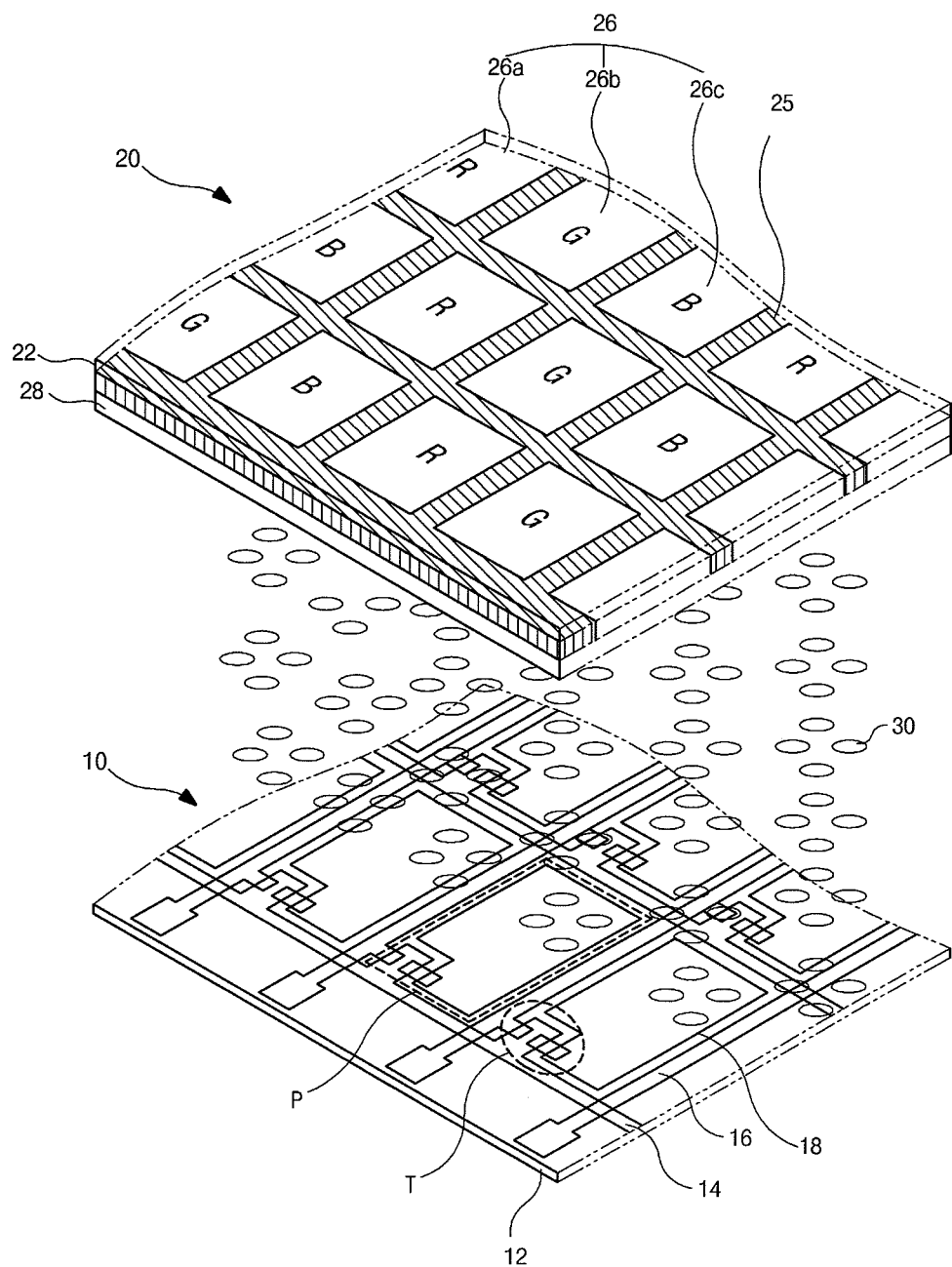
FIG. 1 is a perspective view of an LCD device according to the related art.
Figure 2:
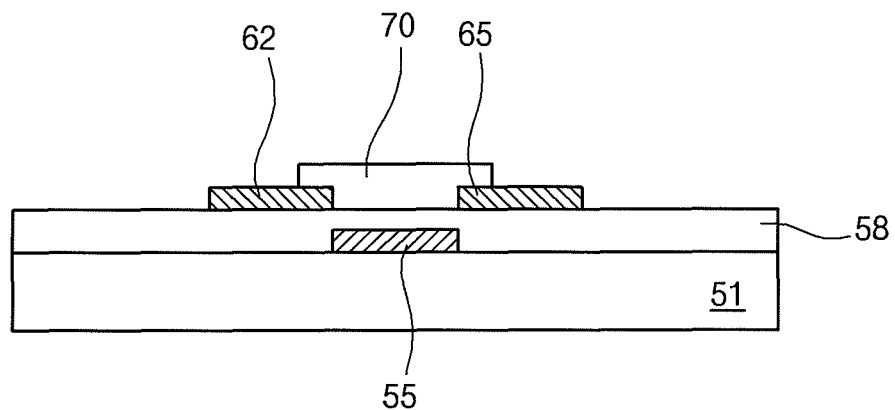
FIG. 2 is a cross-sectional view of a thin film transistor of an array substrate for an LCD device using an organic semiconductor layer according to the related art.
Figure 3A:
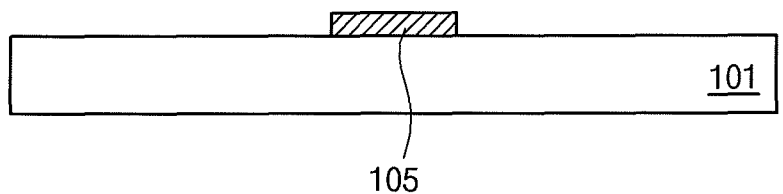

As shown in FIG. 3A, a metallic material is deposited on a substrate 101 and patterned to form a gate electrode 105 and a gate line (not shown). The substrate 101 may be a flexible type substrate such as a plastic substrate or a hard type substrate such as a glass substrate. The metallic material may be deposited with a sputtering method at a temperature of equal to or less than 200 degrees centigrade. A photolithography process, including photoresist-depositing, light-exposing, and developing, may be performed for the deposited metallic material, and then the deposited metallic material may be etched and the photoresist may be stripped, thereby forming the gate electrode 105. A process including the photolithography process, the etching process and the stripping process may be referred to as a mask process.

Figure 3B:
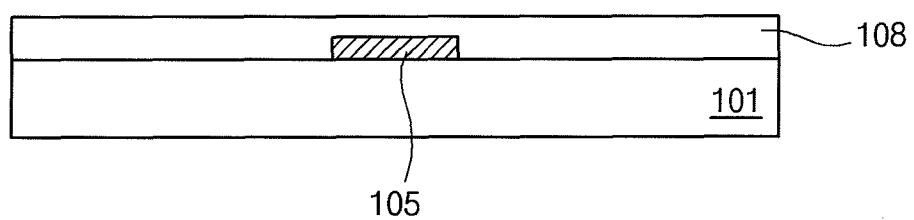

As shown in FIG. 3B, a gate insulating layer 108 is formed on the entire substrate 101 having the gate electrode 105 and the gate line (not shown) at a temperature of equal to or less than 200 degrees centigrade. The gate insulating layer 108 includes at least one organic insulating material such as polyvinylpyrrolidone (PVP) or benzocyclobutene (BCB). Because the gate insulating layer 108 is made of an organic material, the upper surface of the gate insulating layer 108 is even regardless of a step caused by the gate electrode 105.

As shown in FIG. 3C, indium-tin-oxide (ITO) is deposited on the gate insulating layer 108 at a temperature of equal to or less than 200 degrees centigrade and patterned to form source and drain electrodes 112 and 117 and a data line (not shown). The data line is connected to the source electrode 112 and crosses the gate line to define a pixel region. A mask process may be performed for the ITO to form the source and drain electrodes 112 and 117 and the data line, similar to forming the gate electrode 105 and the gate line. Because the upper surface of the gate insulating layer 108 is even, the source and drain electrodes 112 and 117 and the data line do not have steps but are even.

As shown in FIG. 3D, an ion doping process is performed on the entire substrate 101 having the source and drain electrodes 112 and 117. A Group III element, for example, boron (B), may be used for the ion doping process with a dose amount of about $1*10^{14}$ to $9*10^{14}$ ions/cm$^2$. However, other Group III elements, such as aluminum, gallium, indium and thallium, may be used. Pure ITO has a work function of about 4.6 eV to 4.7 eV, and the present doped ITO has a work function of about 4.8 eV to 4.9 eV. Thus, the doped ITO has a work function that is increased by about 0.2 eV compared to pure ITO. Then, a heat treatment is performed at a temperature of equal to or less than 200 degrees centigrade to smooth the surfaces of the source and drain electrodes 112 and 117.

Figure 3E:
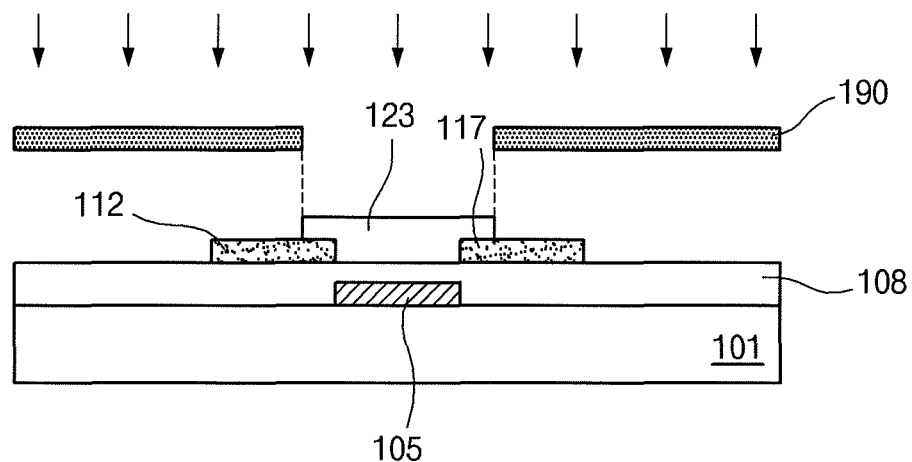

As shown in FIG. 3E, the substrate 101 having the doped source and drain electrodes 112 and 117 and the data line is moved into a process chamber (not shown), and then, an organic semiconductor material is deposited on the substrate 101 to form an organic semiconductor layer 123. The organic semiconductor layer 123 preferably substantially fills the space between the source and drain electrodes 112 and 117 and preferably overlaps at least a part of the source and drain electrodes 112 and 117.

To form the organic semiconductor layer 123, the organic semiconductor material is evaporated at a temperature of equal to or less than 200 degrees centigrade and the evaporated organic semiconductor material is deposited on the substrate 101 having the source and drain electrodes 112 and 117 and the data line using a shadow mask 190. The shadow mask 190 prevents the evaporated organic semiconductor material from being deposited at an undesirable position. Because the organic semiconductor layer 123 is formed of an organic material, it has an even upper surface. The organic semiconductor material may include one or more of pentacene, an arylamine, a thiophene, tetracene, a naphthalene and an anthracene. Pentacene is a p-type organic semiconductor material, and tetracene, naphthalene and anthracene are p-type or n-type organic semiconductor materials.

By way of the above processes, a thin film transistor including a gate electrode 105, source and drain electrodes 112 and 117 and an organic semiconductor layer 123 is formed.

Figure 3F:
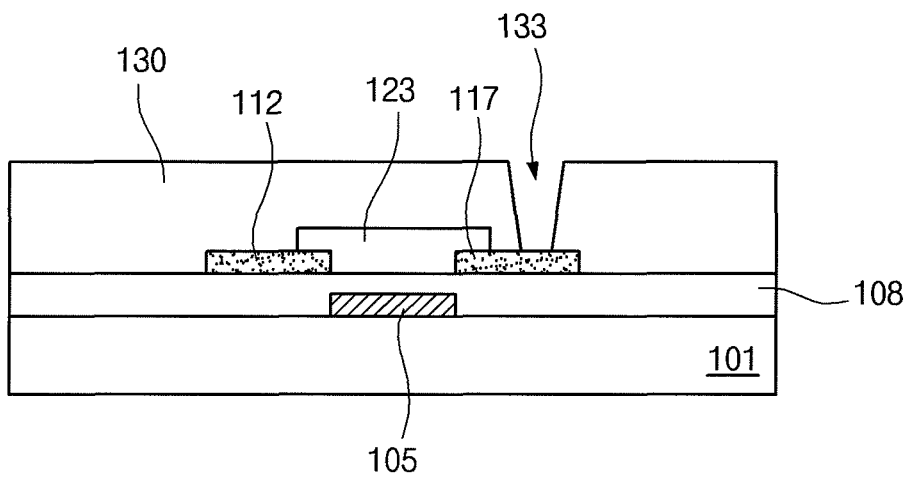

As shown in FIG. 3F, a passivation layer 130 is formed on the entire substrate 101 having the organic semiconductor layer 123 at a temperature of equal to or less than 200 degrees centigrade. The passivation layer 130 may include an organic insulating material or an inorganic insulating material. Then, the passivation layer 130 is patterned to form a drain contact hole 133 exposing at least a part of the drain electrode 117.

Figure 3G:
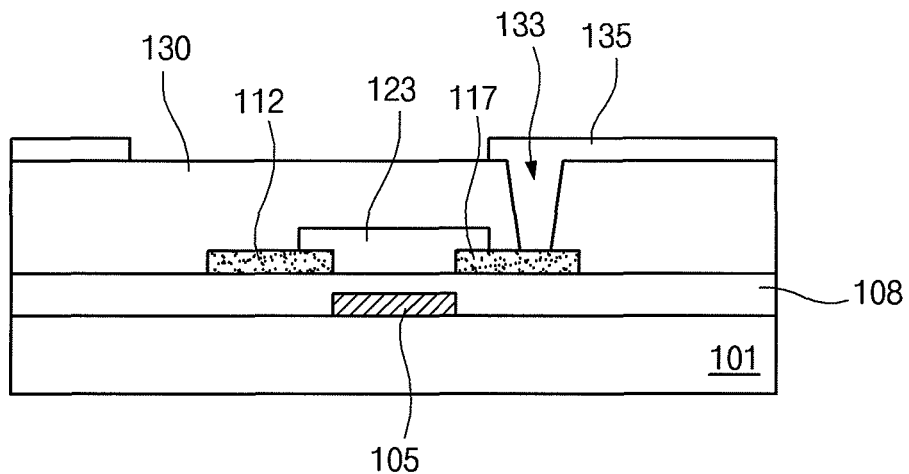

As shown in FIG. 3G, a transparent conductive material is deposited on the passivation layer 130 and patterned with a mask process to form a pixel electrode 135 contacting the drain electrode 117 through the drain contact hole 133. The pixel electrode 135 is formed in each pixel region defined by the crossed gate and data lines. The transparent conductive material may include one or more of indium-tin-oxide (ITO), indium-zinc-oxide (IZO) and indium-tin-zinc-oxide (ITZO).

By way of the above processes, an array substrate including a thin film transistor according to a first exemplary embodiment of the present invention is fabricated.

As explained above, the ITO used for the source and drain electrodes and the data line is doped with boron (B), and thus, the work function of the doped ITO increases compared to pure ITO. Such a work function of doped ITO is greater than the general metallic materials such as silver (Ag), aluminum (Al) and copper (Cu), and is close to the work function of gold (Au). Accordingly, similar to using gold (Au), the energy barrier of the interface between the organic semiconductor layer and the source and drain electrodes made of doped ITO is minimized.

Further, because ITO has good adhesion properties, it cannot be easily removed from the array substrate. Also, because ITO does not easily diffuse, the line width of the data line and the source and drain electrodes can be precisely made. Also, because ITO is cheaper than gold (Au), the product cost can be reduced.

In addition, in an exemplary embodiment, boron (B) may be used for the doping process. Because pentacene is a p-type semiconductor material and tetracene, naphthalene and anthracene can be used as p-type semiconductor materials, boron (B) is an adequate material to dope ITO. Further, doped ITO has a rough surface due to the doping process. Experimentally, boron (B) is a more adequate material to have a rough surface recover into a smooth surface compared to other Group III elements. Therefore, the interface property can be much improved by using boron (B).

FIGS. 4A to 4H are cross-sectional views of a method of fabricating an array substrate including a thin film transistor using an organic semiconductor material according to a second exemplary embodiment of the present invention. The second exemplary embodiment is similar to the first exemplary embodiment, except for adding a low resistance layer for the source and drain electrodes. Accordingly, explanations of parts similar to parts of the first exemplary embodiment are omitted.

Figure 4A:
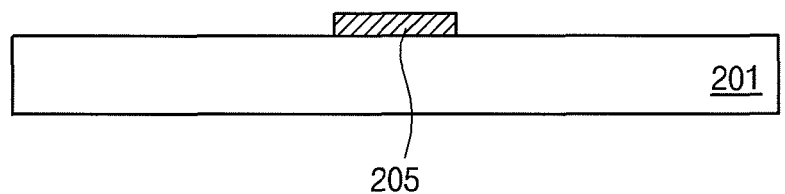
FIGS. 4A to 4H are cross-sectional views of a method of fabricating an array substrate including a thin film transistor using an organic semiconductor material according to a second exemplary embodiment of the present invention.

As shown in FIG. 4A, a metallic material is deposited on a substrate 201 and patterned to form a gate electrode 205 and a gate line (not shown). The substrate 201 may be a flexible type substrate such as a plastic substrate or a hard type substrate such as a glass substrate. The metallic material may be deposited with a sputtering method at a temperature of equal to or less than 200 degrees centigrade. To form the gate electrode 205 and the gate line (not shown), a mask process may be performed.

Figure 4B:
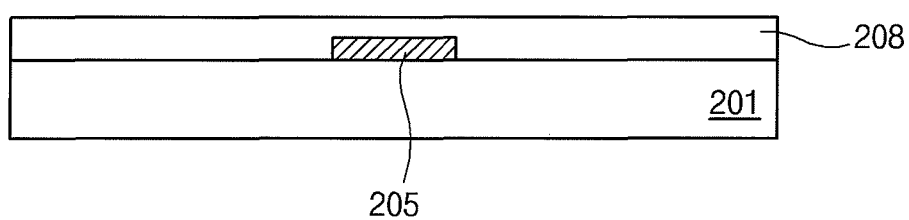

As shown in FIG. 4B, a gate insulating layer 208 is formed on the entire substrate 201 having the gate electrode 205 and the gate line (not shown) at a temperature of equal to or less than 200 degrees centigrade. The gate insulating layer 208 includes at least one organic insulating material such as polyvinylpyrrolidone (PVP) or benzocyclobutene (BCB).

Figure 4C:
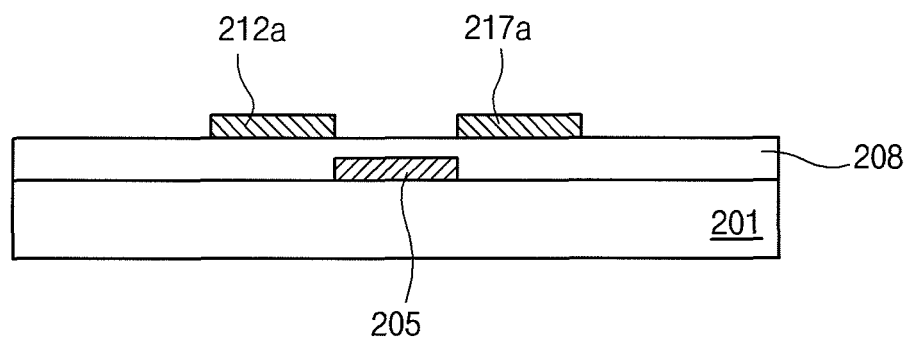

As shown in FIG. 4C, a low resistance metallic material is deposited on the gate insulating layer 208 and patterned to form first source and drain layers 212a and 217a and a data line (not shown). The low resistance metallic material may include at least one of aluminum (Al), aluminum alloy (AlNd), molybdenum (Mo), molybdenum alloy, copper (Cu) and copper alloy.

Figure 4D:
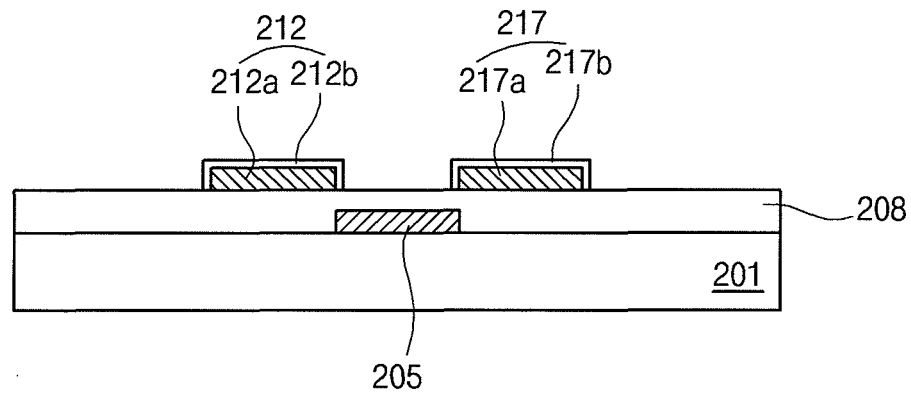

Then, as shown in FIG. 4D, indium-tin-oxide (ITO) is deposited on the substrate 201 having the first source and drain layers 212a and 217a and patterned to form second source and drain layers 212b and 217b. The second source and drain layers 212b and 217b may substantially cover the first source and drain layers 212a and 217a, respectively. The first source and drain layers 212a and 217a have a work function lower than the second source and drain layers 212b and 217b.

The source electrode, which includes both the first and second source layers, is collectively referenced as 212. The drain electrode, which includes both the first and second drain layers, is collectively referenced as 217. That is, the source electrode 212 has a double-layered structure of the first and second source layers 212a and 212b, and the drain electrode 217 has a double-layered structure of the first and second drain layers 217b and 217b.

Figure 4E:
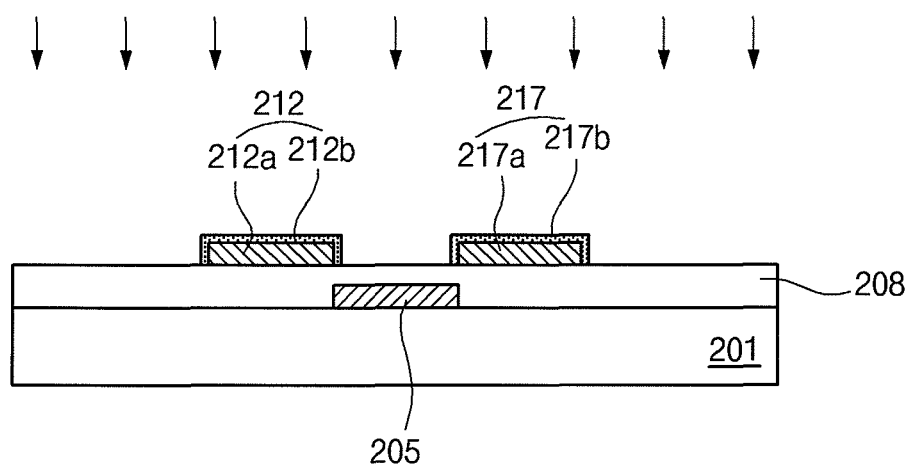

Then, as shown in FIG. 4E, an ion doping process is performed on the entire substrate 201 having the second source and drain layers 212b and 217b. A Group III element, for example, boron (B), may be used for the ion doping process with a dose amount of about $1*10^{14}$ to $9*10^{14}$ ions/cm$^2$. The doped ITO has a work function of about 4.8 eV to 4.9 eV, which is increased by 0.2 eV more than pure ITO. Then, a heat treatment is performed at a temperature of equal to or less than 200 degrees centigrade to smooth the surface of the second source and drain layers 212b and 217b.

As explained above, because the data line is made of a low resistance metallic material, data signal delay can be prevented. When the size of the LCD device increases, if the resistance of the data line is high, a problem is caused that the data signal transferred along the data line is delayed. Therefore, the data line of a low resistance metallic material can effectively prevent data signal delay. It should be understood that the data line can further include an upper layer, such as a doped ITO layer, on the low resistance metallic layer.

Also, because the source and drain electrodes have the second source and drain layers of doped ITO having a high work function, the interface energy barrier between the organic semiconductor layer and the source and drain electrodes can be minimized.

In this way, since a low resistance metallic material and doped ITO are used for the source and drain electrodes and the data line, reduction of signal delay along with minimization of the interface energy barrier can be effectively achieved.

Figure 4F:
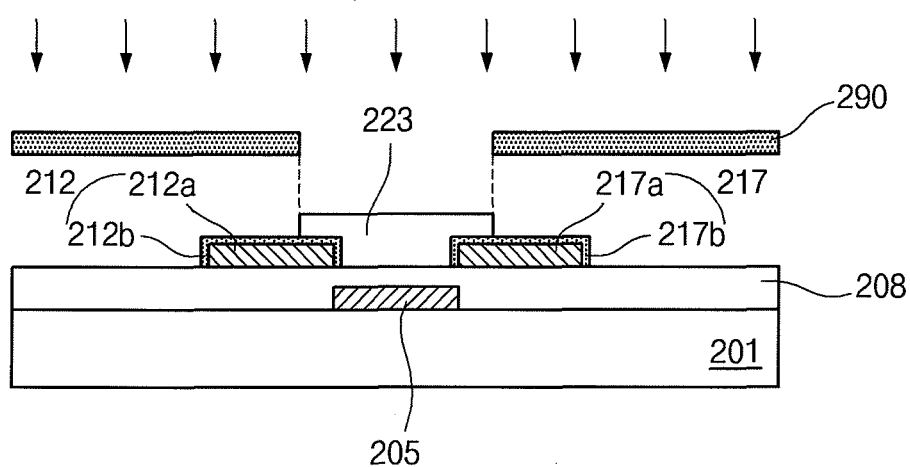

As shown in FIG. 4F, an organic semiconductor material is deposited on the substrate 201 having the source and drain electrodes 212 and 217 and the data line to form an organic semiconductor layer 223. To form the organic semiconductor layer 223, the organic semiconductor material is evaporated at a temperature of equal to or less than 200 degrees centigrade and the evaporated organic semiconductor material is deposited using a shadow mask 290. The organic semiconductor material may include at least one of pentacene, tetracene, naphthalene and anthracene.

By way of the above processes, a thin film transistor including a gate electrode 205, source and drain electrodes 212 and 217 and an organic semiconductor layer 223 is formed.

Figure 4G:
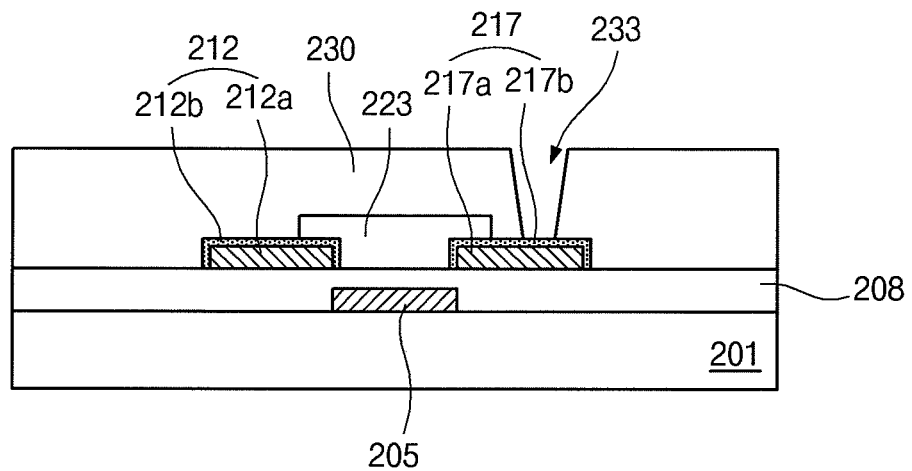

As shown in FIG. 4G, a passivation layer 230 is formed on the entire substrate 201 having the organic semiconductor layer 223. The passivation layer 230 may include an organic insulating material or an inorganic insulating material. Then, the passivation layer 230 is patterned to form a drain contact hole 233 exposing a part of the drain electrode 217.

Figure 4H:
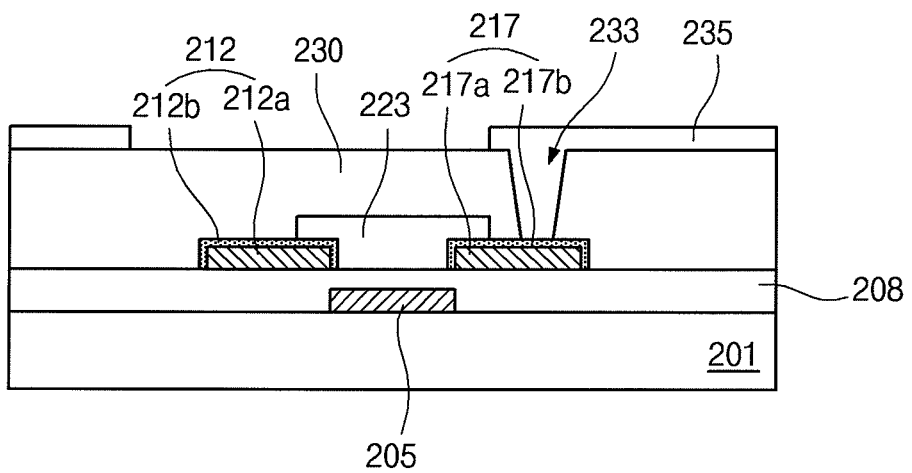

As shown in FIG. 4H, a transparent conductive material is deposited on the passivation layer 230 and patterned to form a pixel electrode 235 contacting the drain electrode 217 through the drain contact hole 233. The pixel electrode 235 is formed in each pixel region defined by the crossed gate and data lines.

By way of the above processes, an array substrate including a thin film transistor according to the second exemplary embodiment is fabricated.

In the above exemplary embodiments, an array substrate for a LCD device using an organic semiconductor material is mainly explained. Also, the present invention can be applicable to other substrates using organic semiconductor materials.

It will be apparent to those skilled in the art that various modifications and variations can be made in the thin film transistor having the organic semiconductor layer, the method of fabricating the thin film transistor, the substrate including the thin film transistor and the method of fabricating the substrate of the present invention without departing from the spirit or scope of the invention. Thus, it is intended that the present invention cover the modifications and variations of this invention provided they come within the scope of the appended claims and their equivalents.

What is claimed is:

1. A method of fabricating a thin film transistor, comprising:

forming a gate electrode on a substrate;

depositing a gate insulating layer on the gate electrode and the substrate at a temperature of equal to or less than 200° C.;

forming source and drain electrodes on the gate insulating layer spaced apart from each other by depositing indium-tin-oxide (ITO) on the gate insulating layer at a temperature less than 200° C., the source and drain electrodes including source and drain layers formed of the ITO doped with at least one Group III element;

forming smooth surfaces of the source and drain layers by heat-treating the source and drain electrodes at a temperature of less than 200° C.; and after the step of forming the smooth surfaces of the source and drain layers, forming an organic semiconductor layer on the gate insulating layer to contact the source and drain layers that are formed of the ITO doped with at least one Group III element and have the smooth surfaces, wherein an upper surface of the gate insulating layer is even so that the source and drain electrodes do not have steps in a cross section but are smooth and even, wherein the forming of the organic semiconductor layer includes evaporating the organic semiconductor layer at a temperature of less than 200° C. and depositing the evaporated organic semiconductor material on the substrate having the source and drain electrodes by using a shadow mask, and wherein the heat treating of the source and drain electrodes is performed to recover and smooth at least one roughened doped ITO surface of the source and drain electrodes from the depositing of the ITO.

2. The method according to claim 1, wherein the Group III element is boron.

3. The method according to claim 1, wherein the indium-tin-oxide is doped with the at least one Group III element in a dose range of about $1*10^{14}$ to $9*10^{14}$ ions/cm$^2$.

4. The method according to claim 1, wherein the organic semiconductor layer comprises at least one of pentacene, an arylamine, a thiophene, tetracene, a naphthalene and anthracene.

5. The method according to claim 1, wherein the organic semiconductor layer substantially fills the space between the source and drain electrodes and overlaps at least a part of the source and drain electrodes.

6. The method according to claim 1, wherein the gate insulating layer comprises at least one of benzocyclobutene (BCB) and polyvinylpyrrolidone (PVP).

* * * * *